(12) United States Patent
Brown (10) Patent No.: US 6,267,856 B1
(45) Date of Patent: Jul. 31, 2001

(54) PARALLEL ACTION HOLDING CLAMP FOR ELECTROPLATING ARTICLES

(75) Inventor: Howard Brown, Pointe-Claire (CA)

(73) Assignee: M & B Plating Racks Inc., Quebec (CA)

(*) Notice: Subject to any disclaimer, the term of this patent is extended or adjusted under 35 U.S.C. 154(b) by 0 days.

(21) Appl. No.: 09/497,704

(22) Filed: Feb. 4, 2000

(51) Int. Cl.[7] ..................................................... C25D 9/02
(52) U.S. Cl. ........................... 204/297.06; 204/297.07; 204/297.09; 204/297.1; 204/279; 204/286.1; 204/288.1; 204/288.3
(58) Field of Search .................... 204/279, 297.06, 204/297.07, 297.09, 297.1, 286.1, 288.1, 288.3

(56) References Cited

U.S. PATENT DOCUMENTS

| | | |
|---|---|---|
| 1,282,259 | 10/1918 | Merritt et al. . |
| 2,190,440 | 2/1940 | Beebe . |
| 2,367,909 | 1/1945 | Wanner . |
| 5,876,585 | * 3/1999 | Schenk ................................ 204/279 |
| 5,901,997 | * 5/1999 | Bayer ............................... 204/297.09 |
| 5,904,820 | 5/1999 | Brown et al. ........................ 204/225 |
| 5,932,081 | * 8/1999 | Kopp et al. ..................... 204/297.09 |

FOREIGN PATENT DOCUMENTS 1215939   12/1986   (CA) .

* cited by examiner

Primary Examiner—Bruce F. Bell
(74) Attorney, Agent, or Firm—François Martineau (57) ABSTRACT

A holding clamp device, for releasably holding a thick planar article over ground, comprising: an elongated main arm member, defining first and second opposite end portions; a pair of first and second tubular bar members, each defining an outer end portion and an opposite inner end portion; a rail member, integral to an intermediate section of the main arm member and slidably engaged by the second bar member inner end portion, wherein the second bar member is maintained by the rail member parallel to the first bar and wherein the second bar member is movable relative to the first bar member while continuously remaining parallel thereto; a first biasing member, continuously biasing the first and second bar members toward one another; and a second biasing member, for discretely biasing the second bar member away from the first bar member, against the continuous bias of the first biasing member.

9 Claims, 12 Drawing Sheets

FIG. 15

PARALLEL ACTION HOLDING CLAMP FOR ELECTROPLATING ARTICLES

FIELD OF THE INVENTION

The present invention relates to a clamp for holding thick planar articles such as thickened plates or the like, and more particularly to a clamp for holding multilayer printed circuit boards in an electroplating acid bath.

BACKGROUND OF THE INVENTION

It is known in the art of electroplating to use frames on which are removably anchored plates or the like articles to be plated, for holding them while they are being submerged in large acid tanks or baths, e.g. for creating printed circuit boards.

In applicant's U.S. Pat. No. 5,904,820 issued May 18, 1999, there was disclosed and claimed a holding clamp for releasably holding an article to be submerged in a liquid solution bath ahead of a submerged anode bar and to be electroplated therein. This patented holding clamp, destined to downwardly depend from an overlying cathode frame bar, comprises a first and a second elongated arm members made of an electrically conducting material and each defining a lower portion coated with a fluid-tight and electrically insulating sleeve, and an upper and a lower end, the first arm member to be fixedly attached to the cathode frame bar at its upper end, the second arm member being shorter than the first arm member and being pivotally attached to the first arm member and being pivotable between a first limit position in which the lower ends are spaced from one another and a second limit position in which the lower ends abut against one another, the first arm member having electrical current conduction means physically accessible at its lower end. Biasing means biases the arm members lower ends against one another, and a lever member pivotally attached to an intermediate section of the first arm member and located entirely above the first and second arm member sleeves at all times selectively forcibly pivotally biases the second arm member into the first limit position against the action of the biasing means. In this way, the first and second arm members are destined to frictionally hold the article to be electroplated between their lower ends when the second arm member is in its second limit position, thus allowing current to be conducted through the conduction means into the article, with the first and second arm member lower portions destined to be submerged in the solution at the most partially up their sleeves.

Such a holding clamp device is very efficient for holding thin single layer planar articles. However, recent technical developments in the printed circuit boards have brought about thicker, multiple layer printed boards. Because of their greater overall thickness, the jaw studs of the prior art holding clamps are much more spread apart than before. Since the relative movement between the two jaws is a pivotal one about a circle of an arc, when the jaws are opened from their closed condition, the jaws do not remain parallel to one another and accordingly, the studs become eventually axially offset relative to one another. This means that electrical conduction between the studs from the two opposite jaws from a given clamp, becomes compromised in a progressively increasing fashion as the jaws are progressively pivoted away from one another.

OBJECTS OF THE INVENTION

The gist of the present invention is therefore to improve upon applicant's U.S. Pat. No. 5,904,820, by providing means for relative movement of the pair of jaws from an article holding device, that will constantly maintain the pair of jaws parallel to one another during their relative movement to accommodate therebetween an article of varying thickness to be frictionally taken in sandwich therebetween.

A corollary object of the present invention is to address the requirements for holding state of the art printed circuit boards over acid baths.

General objects of this invention include: that the holding device be easy and quick to operate; and that the holding device require only one operation for installing or retrieving an article therefrom.

SUMMARY OF THE INVENTION

In accordance with the objects of the invention, there is disclosed a holding clamp for releasably holding a thickened planar article to be submerged in a liquid solution bath ahead of a submerged anode bar and to be electroplated therein, said holding clamp destined to downwardly depend from an overlying cathode frame bar, said holding clamp comprising:

a) an elongated main arm member, made from an electrically conducting material, and defining first and second opposite end portions;

b) a pair of first and second tubular bar members, each defining an outer end portion coated with a fluid-tight and electrically insulating sleeve and an opposite inner end portion, each bar member outer end portion having a transverse terminal stud projecting therefrom, said first bar member anchored at its said inner end portion to said main arm member first end portion parallel thereto;

c) a rail member, integral to an intermediate section of said main arm member and slidably engaged by said second bar member inner end portion, wherein said second bar member is maintained by said rail member parallel to said first bar and wherein said second bar member is movable relative to said first bar member while continuously remaining parallel thereto, while the pair of said terminal studs remain coaxially aligned;

d) a first biasing member, continuously biasing said first and second bar members toward one another; and e) a second biasing member, for discretely biasing said second bar member away from said first bar member, against the continuous bias of said first biasing member.

Preferably, said first biasing means includes at least one pair of coil springs, hookingly interconnecting said first and second bar members. Also, said second biasing member could include an arcuate cantilever member defining an engagement leg and an opposite actuation leg, said engagement leg extending between said first and second bar members within their common plane, and a pivotal linkage assembly integral to said main arm member and pivotally mounting an intermediate section of said arcuate cantilever member; wherein upon actuation of said actuation leg to move the latter away from said main arm member, pivotal motion of said cantilever member will bring about frictional engagement of said cantilever member engagement leg against said second bar member for displacement of the latter away from said first bar member.

Said cantilever member engagement leg preferably includes a bevelled tip.

According to a first embodiment of the invention, there is further provided an elongated handle, operatively mounted to said pivotal linkage assembly for facilitating actuation of said actuation leg.

Said second biasing member could then include an arcuate cantilever member defining an engagement leg and an opposite actuation leg, said engagement leg extending between said first and second bar members within their common plane, an elongated elbowed handle member integrally carried by said actuation leg coextensively thereto, and a straight link arm pivotally mounted to an intermediate section of said main arm member and pivotally mounting an intermediate section of said handle member; wherein upon actuation of said handle to move the latter toward said main arm member, there will be brought about frictional engagement of said cantilever member engagement leg against said second bar member for displacement of the latter away from said first bar member.

This invention also relates to an alternate embodiment of holding clamp, for releasably holding an article to be submerged in a liquid solution bath ahead of a submerged anode bar and to be electroplated therein, said holding clamp destined to downwardly depend from an overlying cathode frame bar, said holding clamp comprising:

a) an elongated main arm member, made from an electrically conducting material, and defining first and second opposite end portions;

b) a pair of first and second tubular bar members, each defining an outer end portion coated with a fluid-tight and electrically insulating sleeve and an opposite inner end portion, each bar member outer end portion having a transverse terminal stud projecting therefrom, said first bar member anchored at its said inner end portion to said main arm member first end portion parallel thereto;

c) an endless screw member, integral to an intermediate section of said main arm member and to said second bar member inner end portion, said endless screw member maintaining said first and second bar members parallel to each other, and said second bar member being movable relative to said first bar member while continuously remaining parallel thereto, while the pair of said terminal studs remain coaxially aligned; and d) a biasing member, for discretely actuating said endless screw member for biasing said second bar member away from or toward said first bar member.

Preferably, said biasing member is an enlarged wheel, carried at a free end portion of said endless screw member, said wheel being manually rotatable by an operator.

The invention also extends more generally to a holding clamp device, for releasably holding a thick planar article over ground, comprising:

a) an elongated main arm member, defining first and second opposite end portions;

b) a pair of first and second tubular bar members, each defining an outer end portion and an opposite inner end portion, c) a rail member, integral to an intermediate section of said main arm member and slidably engaged by said second bar member inner end portion, wherein said second bar member is maintained by said rail member parallel to said first bar and wherein said second bar member is movable relative to said first bar member while continuously remaining parallel thereto d) a first biasing member, continuously biasing said first and second bar members toward one another; and e) a second biasing member, for discretely biasing said second bar member away from said first bar member, against the continuous bias of said first biasing member.

DETAILED DESCRIPTION OF THE PREFERRED EMBODIMENTS

Figure 1:
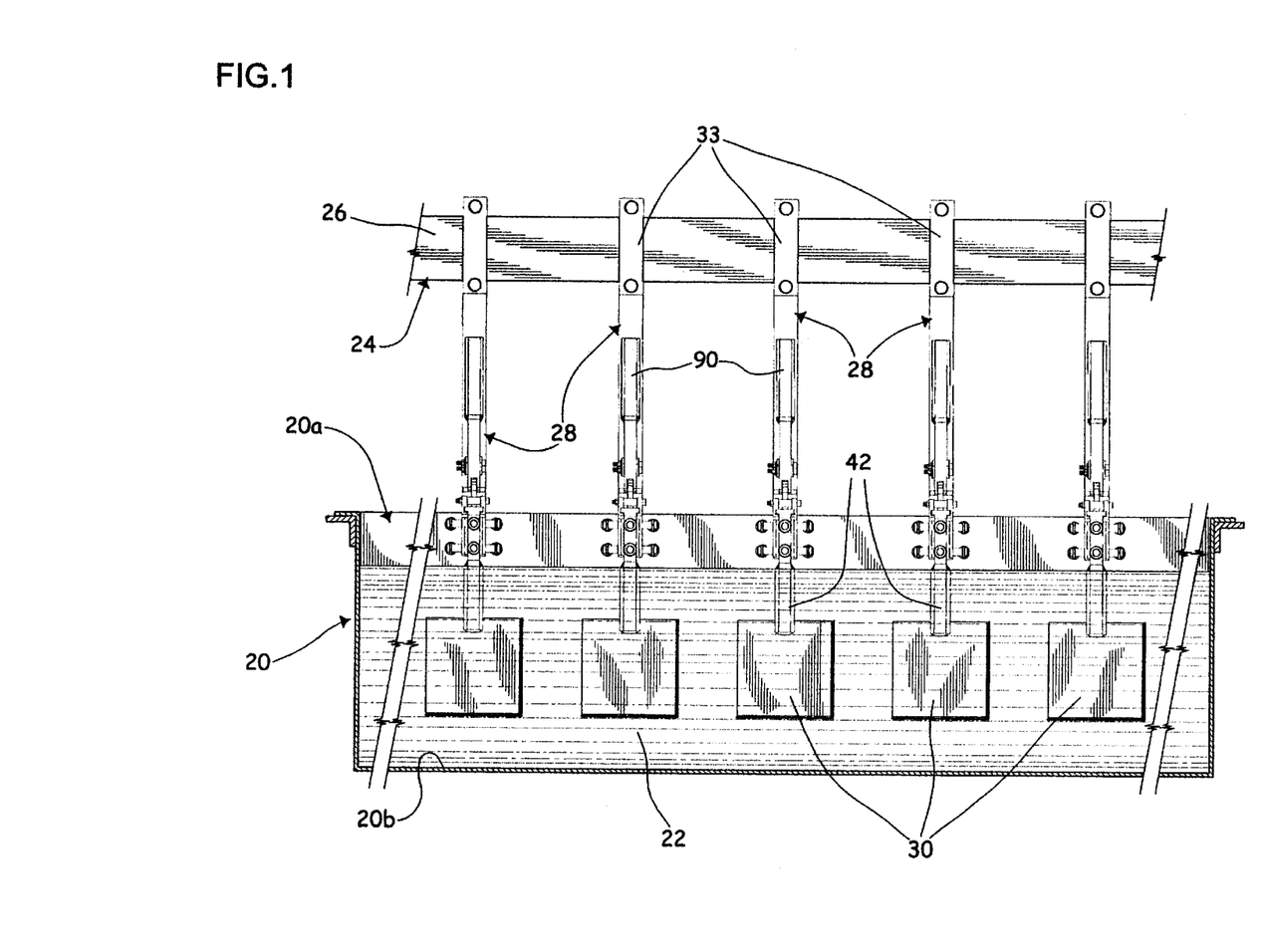
FIG. 1, is a front elevational sectional view of an acid bath showing an overhanging horizontally supported cathode bar holding a number of downwardly depending holding clamps supporting circuit boards to be electroplated according to a first embodiment of the invention.

FIG. 1, shows a liquid solution bath or tank 20, with a top mouth 20a and a bottom wall 20b and which contains an acid solution 22. A frame 24 overhangs the top mouth 20a of acid tank 20. Frame 24 comprises a flight bar acting as a negatively charged cathode bar 26. From cathode bar 26 downwardly depend a number of holding clamps 28 according to a first embodiment of the invention, and illustrated in FIGS. 2 to 9. Holding clamps 28 are each adapted to hold a thickened planar article 30 to be electroplated, usually of a flat rectangular thick plate as shown in the drawings, through mouth 20a and into acid batch 20 but spacedly over the bottom wall 20b of the tank 20.

Frame 24 is movable between a lower and an upper limit position, as known in the art. In its upper limit position, the articles 30 clear the mouth 20a of the acid bath 20 and the liquid acid volume 22, while in its lower limit position, the clamps 28 extend through mouth 20a and the articles 30 are entirely submerged into the liquid acid volume 22 but spacedly over bottom wall 20b.

When powering means (not shown) are activated, a voltage difference is generated between the cathode element and the anode element, and current is transmitted from the anode element through the acid in the bath, the article, the holding clamp to the cathode bar. This way, the positively charged ions composing the metallic (copper, gold or another suitable metal) anode element are conveyed by the acid solution—being used as a carrier means—and fix themselves to the article 30 outer surface, thus effectively electroplating article 30.

Figure 5:
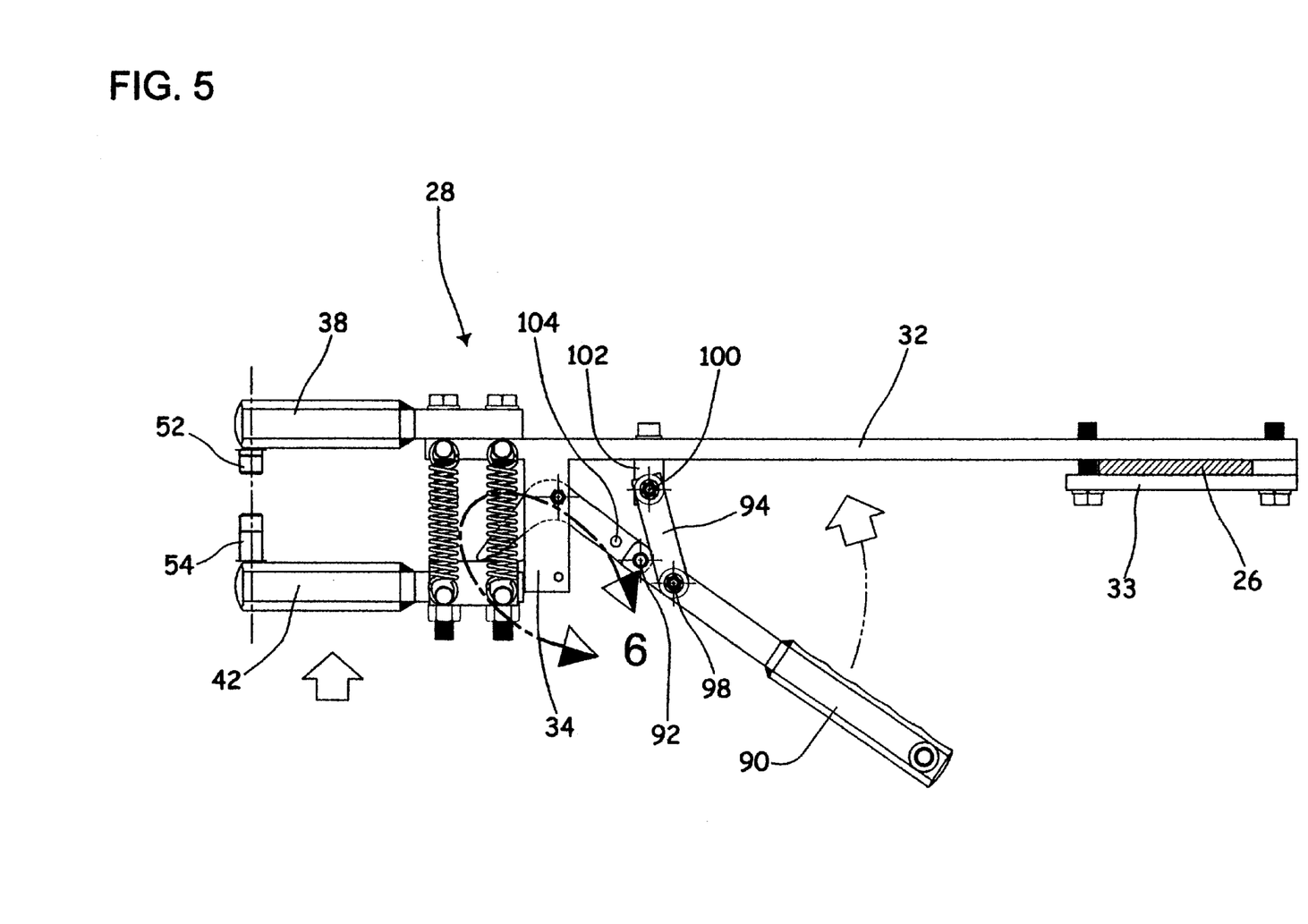
Figure 6:
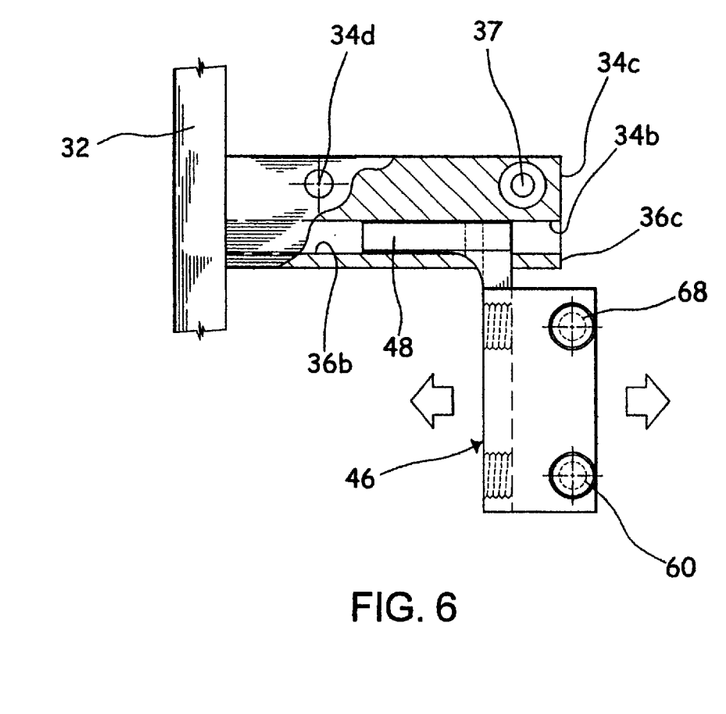
FIG. 6, is partly broken view at an enlarged scale of the area circumscribed by ellipse 6 of FIG. 5.
Figure 7:
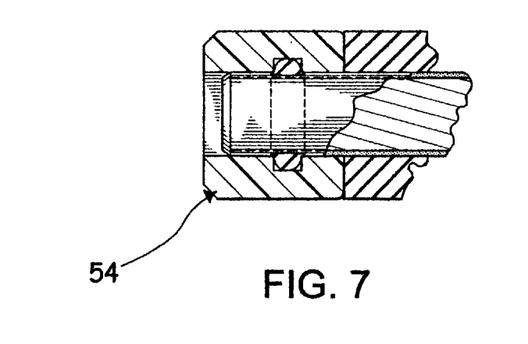
FIG. 7, is an enlarged view of the area taken within ellipse 7 of FIG. 8.
Figure 8:
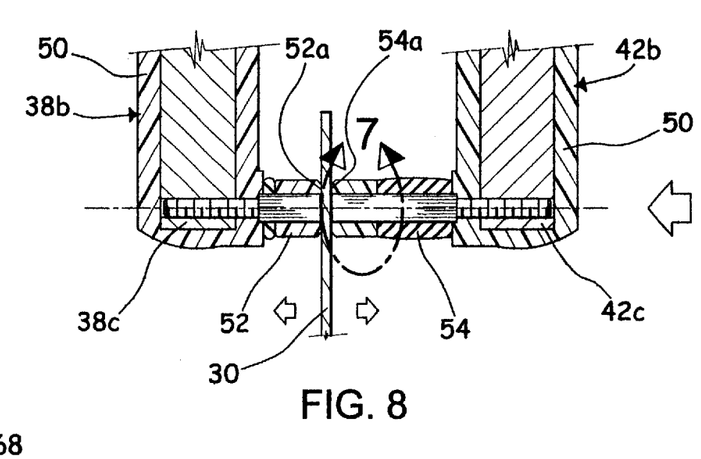
FIG. 8, is a cross-sectional view of the closed jaws from FIG. 4.
Figure 9:
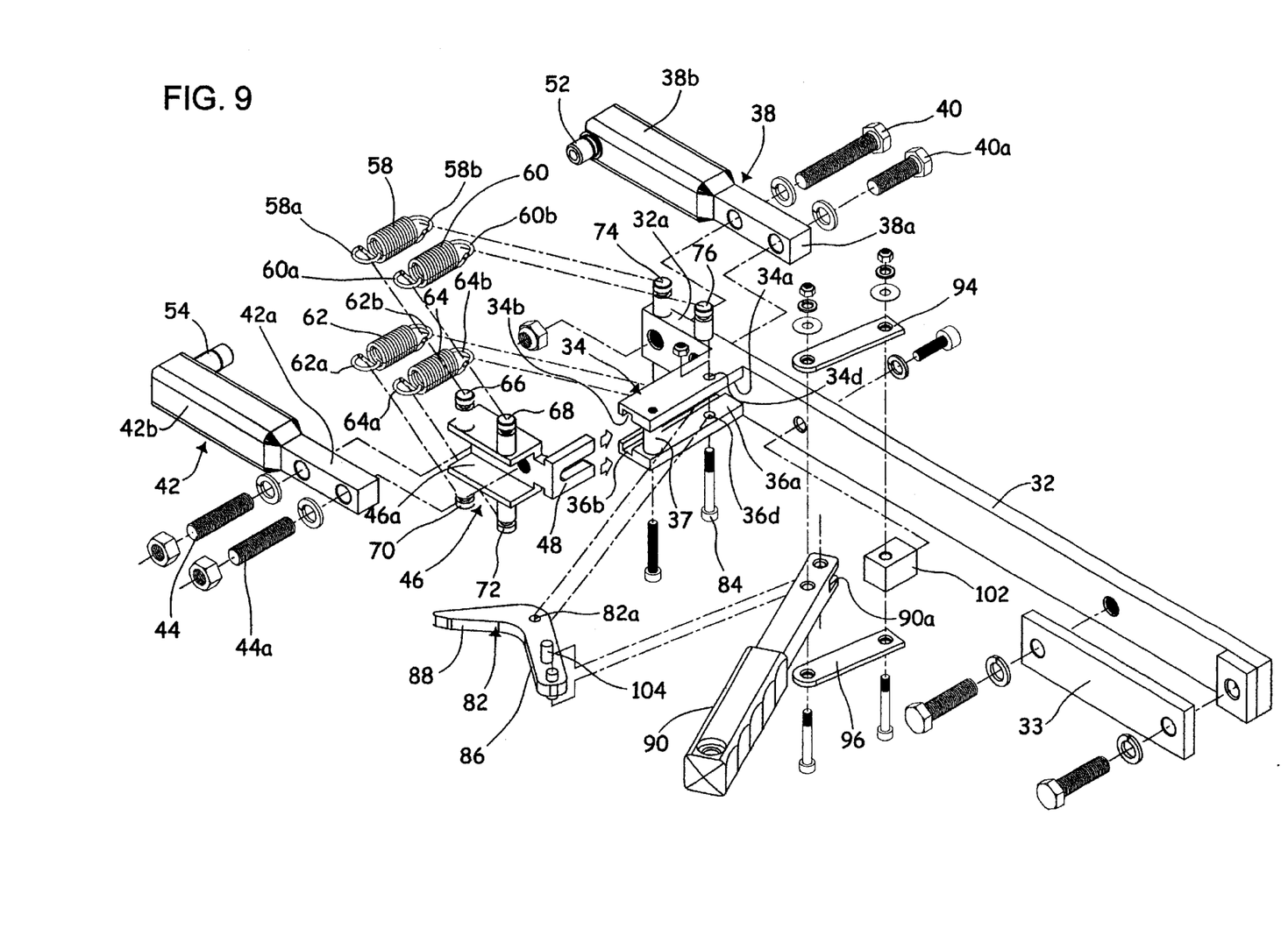
FIG. 9, is an exploded view of the first embodiment of holding clamp from FIGS. 1–8.
Figure 10:
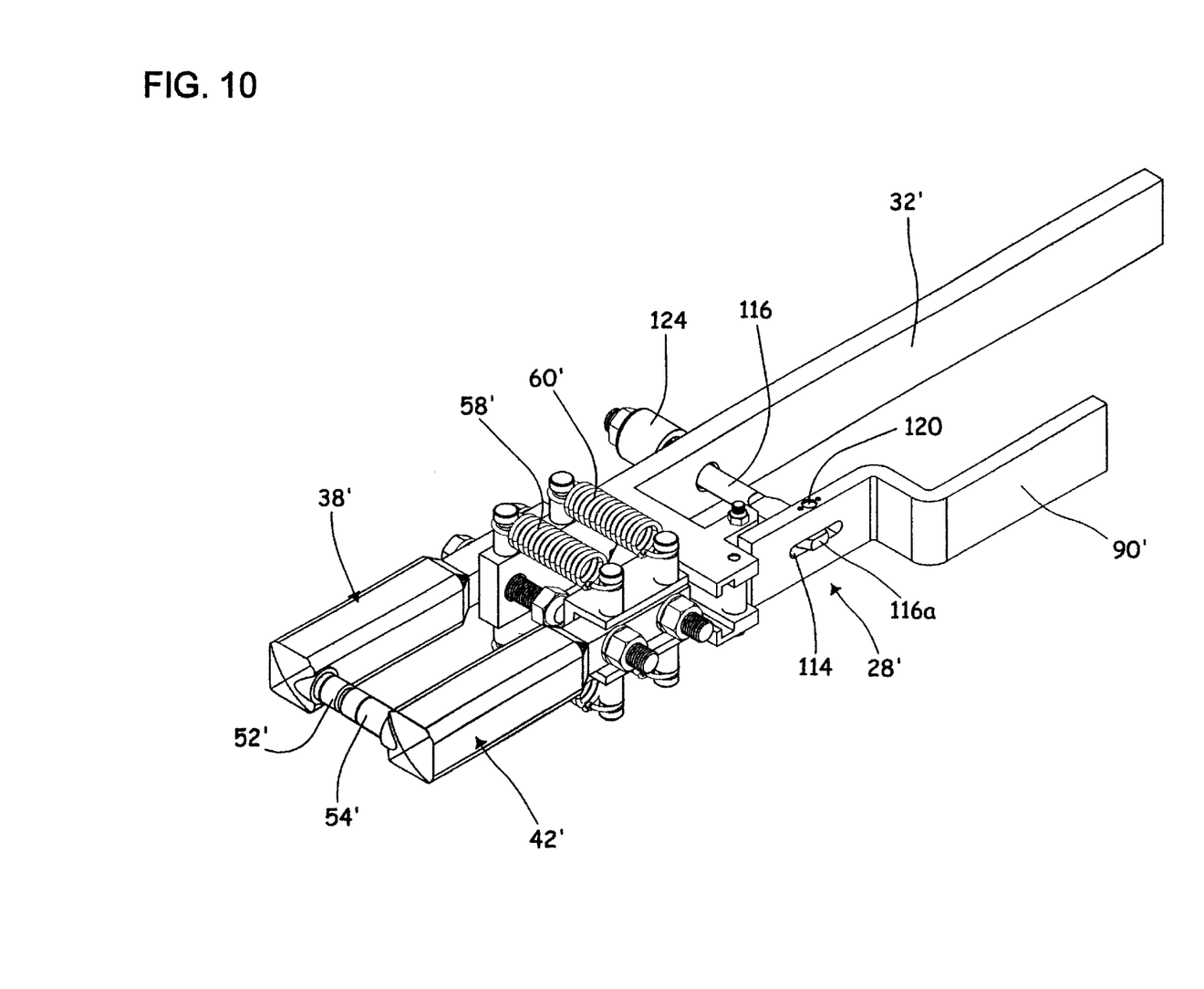
FIG. 10, is a view similar to FIG. 2 but for a second embodiment of holding clamp, with its jaws again in closed condition.

The first embodiment of holding clamp 28 is illustrated in FIGS. 2 to 9. As best shown in FIGS. 5 and 9, holding clamp includes an elongated clamp arm 32 having at one end a fastening band assembly 33, for transverse attachment of the horizontal support element (as already discussed in applicant prior U.S. Pat. No 5,904,820, supra, and a pair of integral spaced elongated brackets 34, 36, extending transversely from an intermediate section of clamp arm 32 wherein a short end portion thereof 32a remains, and being in spaced register with one another. Each bracket 34, 36, includes on a fraction of its interior planar face 34a, 36a, an inturned groove 34b, 36b in facing register with one another, and an outer free end portion 34c, 36c, opposite main arm 32.

A spacer member 37 (FIG. 9) is mounted between the outer free end portions 34c, 36c, of brackets 34, 36. A first stud support tubular bar 38 is fixedly anchored by bolts 40, 40a, at one inner end portion thereof 38a to the clamp arm end portion 32a parallel thereto. A second stud support tubular bar 42 is fixedly anchored by bolts 44, 44a, at one inner end portion thereof 42a to a carriage member 46. This tubular bar end portion 42a is engaged into a complementary open channel section 46a made in the carriage member 46. Carriage member 46 includes a transverse U-shape end tubular slider member 48, sized for slidable complementary engagement through the mouth formed between the free end portions 34c, 36c, of transverse brackets 34, 36, and into and along the cross-sectionally U-shape grooves 34b, 36b of the clamp arm transverse brackets 34, 36, towards main arm 32, wherein tubulars bars 38 and 42 remain parallel to one another. Accordingly, as carriage member 46 slides along the rails formed by bracket grooves 34b, 36b, second stud support tubular bar 42 is movable relative to stationary first stud support tubular bar 38, while both bars 38, 42 remain parallel to one another at all times.

Figure 2:
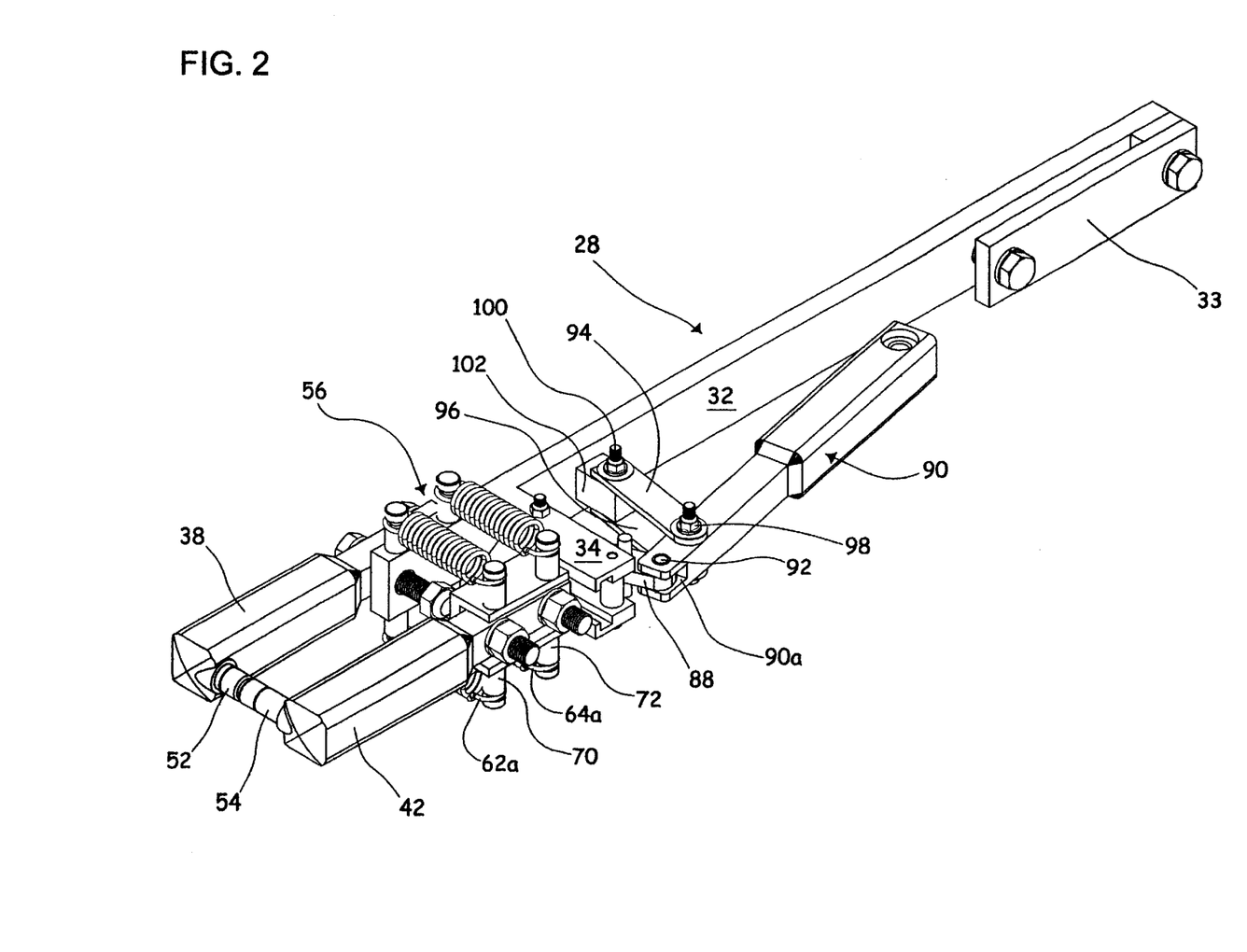
FIG. 2, is an enlarged perspective view of a first embodiment of holding clamp, with its jaws in closed condition.
Figure 3:
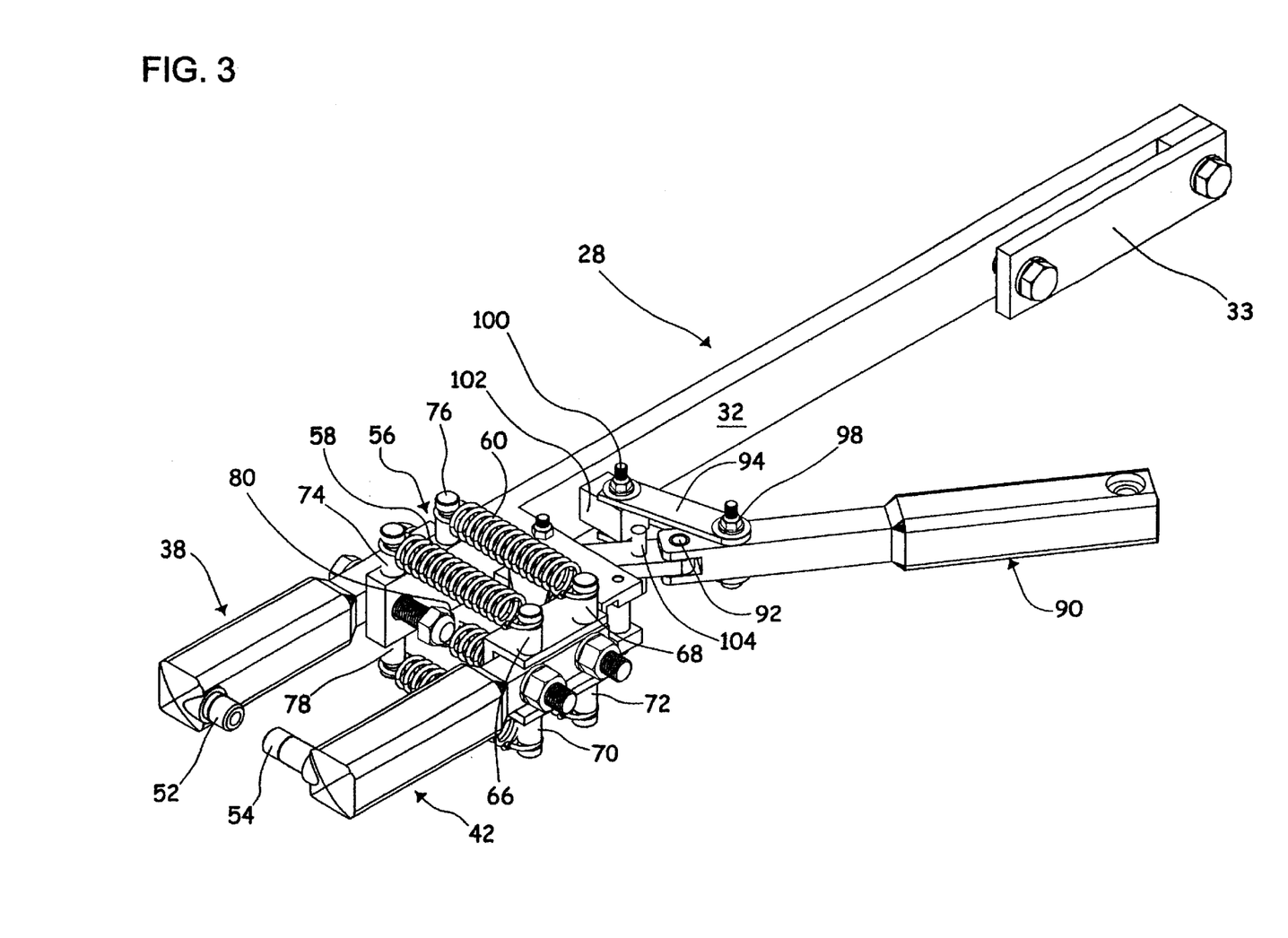
FIG. 3, is a view similar to FIG. 2, but showing the jaws in their opened condition after pivotal action of the central lever under manual bias from the operator.
Figure 4:
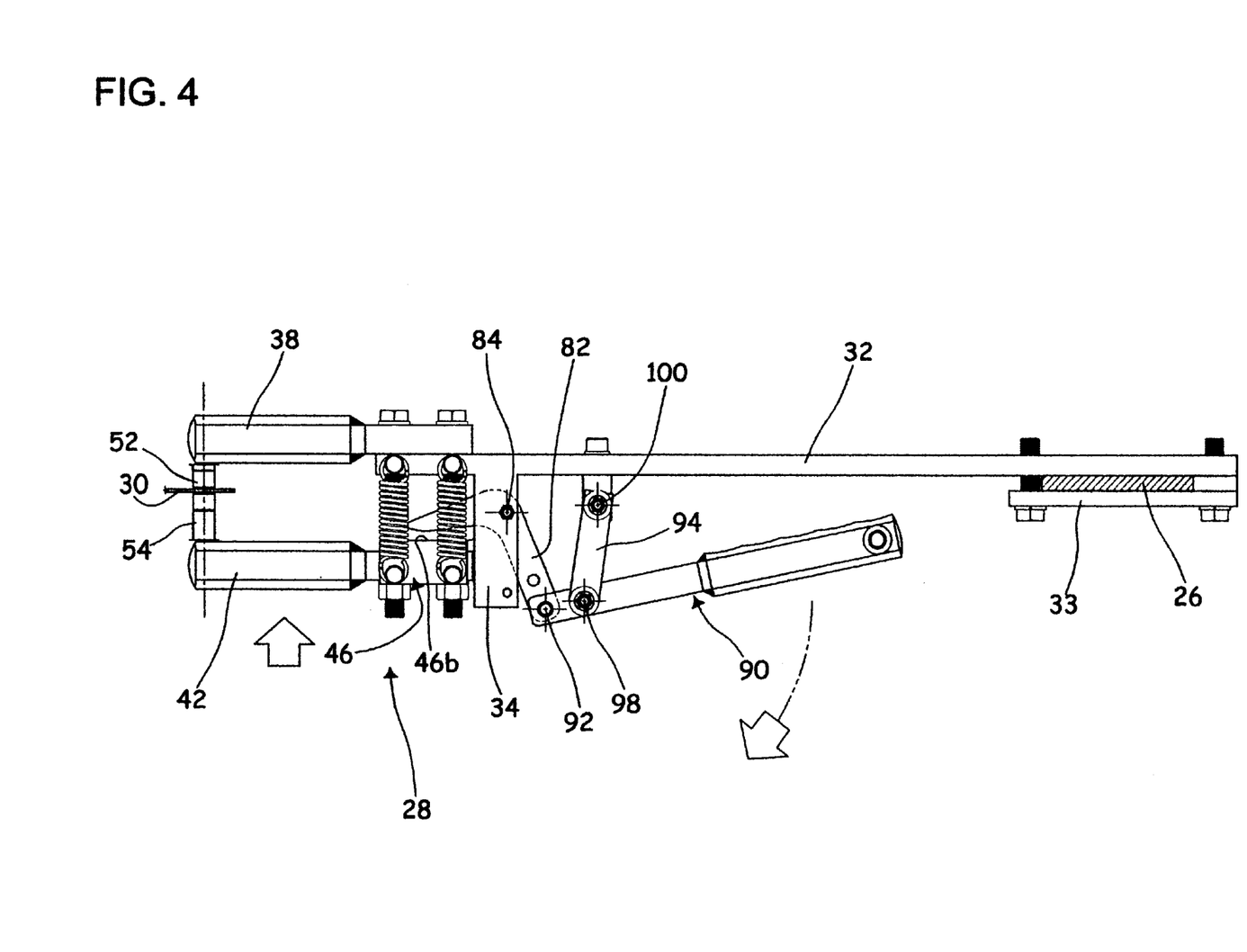
FIGS. 4 and 5, are plan views of the holding clamp in their conditions of FIGS. 2 and 3, respectively.

Each tubular bar 38, 42 is as generally described in applicant's U.S. Pat. No. 5,904,820, supra, and thus further includes (FIG. 8) an outer end portion 38b, 42b, covered by a corrosion-resistant, fluid-tight and electrically insulating protective sheath 50, opposite inner end portions 38a, 42a; and a cylindroid stud 52, 54, projecting inwardly transversely from the corresponding free end 38c, 42c, of sheathed end portion 38b, 42b, the studs 52, 54, being coaxially aligned. As suggested in FIGS. 2 and 4, biasing means 56 are provided to continuously bias tubular arms 38, 42 toward one another, and thus, the free inner ends 52a, 54a of the cylindroid studs 52, 54, coaxially against one another (typically taking a planar board article 30 in sandwich therebetween). Preferably, biasing means 56 preferably includes two pairs of coil springs 58, 60, 62, 64; one end 58a, 60a, 62a, 64a, of these four coil springs hook around integral ears 66, 68, 70, 72, transversely projecting from carriage member 46 orthogonally to slider 48, while the opposite end 58b, 60b, 62b, 64b of these four coil springs hook around integral ears 74, 76, 78, 80 projecting transversely from the end portion 32a of the clamp main arm 32. Ears 66, 68, extend in a direction opposite ears 70, 72; while ears 74, 76, extend in a direction opposite ears 78, 80, wherein, as best illustrated in FIGS. 2 and 3, the coil springs 58–64 clear the passageway of the carriage member 46 between the two tubular bars 38, 42. Accordingly, coil springs 58–64 continuously biases the opposite pair of otherwise spaced studs 52, 54, to firmly coaxially abut against each other, while the tubular bars 38, 42, remain consequently spaced from one another and parallel to one another. As the tubular bars 38, 42, are forcibly spread apart to put a planar board article 30 in between the studs 52, 54, the coil springs 58–64 are stretched (FIG. 3) from their initial released condition (FIG. 2).

According to the specific features of the present invention, and as clearly shown in FIG. 9, a generally V-shape cantilever member 82 is mounted between the two spaced brackets 34, 36, for relative movement therebetween. Cantilever member 82 includes a bore 82a at its intermediate apex, and brackets 34, 36, include a pair of registering bores 34d, 36d, extending through their ungrooved planar faces 34a, 36a, wherein a half-threaded bolt 84 extends through bores 82a, 34d, 36d, for pivotally interconnecting the cantilever member 82 to the brackets 34, 36. Bores 34d, 36d, are proximate arm 32, so that cantilever member 82 clear the carriage slider 48 at all times. Cantilever member 82 further includes a first leg 86 having a bevelled tip 86a, extending in between stud bars 38, 42, and a second opposite leg 88, extending away from stud bars 38, 42 and diverging from main arm 32. Cantilever member outer leg 88 is maneuverable to pivot cantilever member inner leg 86 in between the two stud holding bars 38, 42, and to spread apart the latter against the bias of the coil springs 58–64, since the bevelled tip 86a of first leg 86 is slidingly frictionally engageable against the smooth external face 46b (FIG. 4) of carriage member 46 opposite U-shape channel 46.

To facilitate actuation of cantilever leg 88, there is provided a manual lever handle bar 90. Elongated handle bar 90 includes a bored recess 90a at its inner end portion, for free engagement by the free end portion of cantilever leg 88 which transversely integrally carries a first innermost finger 92 for pivotal engagement with the opposite bores of the recess 90a. In addition, a pair of link rods 94, 96, (FIG. 2) pivotally interconnect a pivot mount 98 at an intermediate section of handle bar 90, and another pivot mount 100 on a bracket 102 extending transversely inwardly from an intermediate section of the clamp main arm 32 and in general transverse register with pivot mount 98. Therefore, as the handle bar 90 is pivoted from its released condition illustrated in FIG. 2, away from main arm 32 toward its loaded condition illustrated in FIG. 3, the bevelled end 86a of cantilever arm 82 slidingly abuts against carriage member 46 and the latter and associated stud bar 42 is brought into motion away from stud bar 38 against the bias of coil springs 58–64.

Preferably, a transverse stopper pin 104 (FIG. 9) is provided to V-cantilever arm 82 intermediate bore 82a and pivot mount 92, to prevent accidental movement of stud bar 42 away from stud bar 38 beyond a set relative distance therebetween, by coming to transversely abut against the link rods 94, 96 should the handle bar 90 be pivoted away beyond a set threshold as suggested in FIG. 5 of the drawings.

Figure 11:
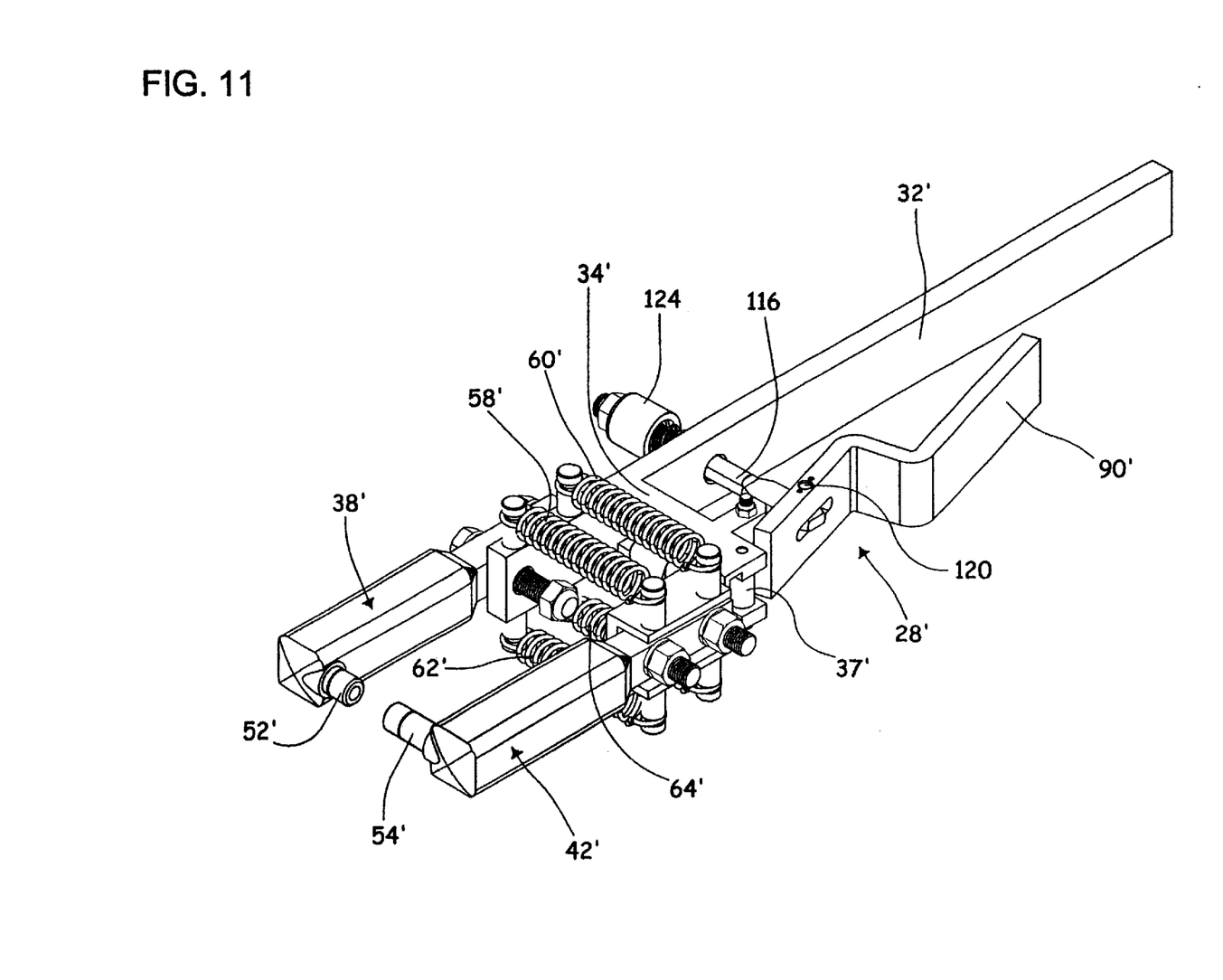
FIG. 11, is a view similar to FIG. 10, but showing the jaws in their opened condition after pivotal action of the central lever under manual bias from the operator.
Figure 12:
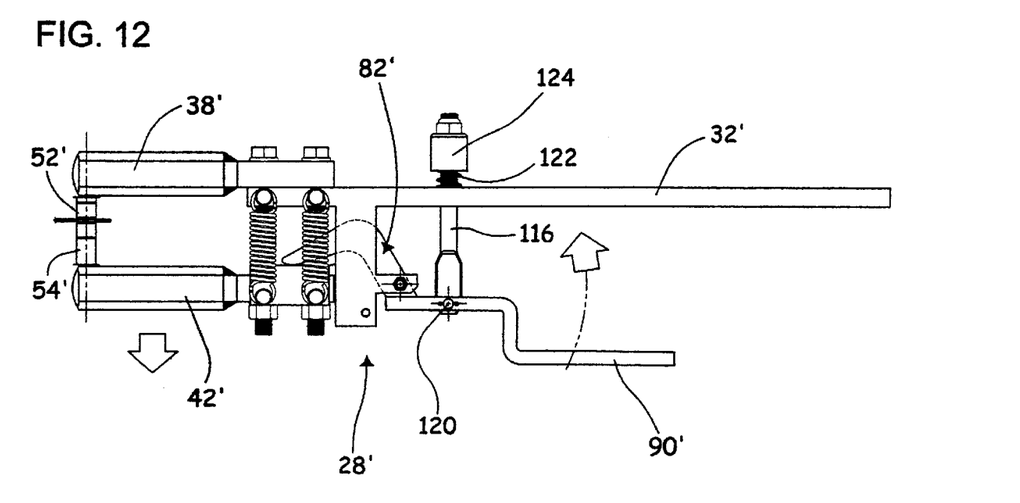
FIGS. 12 and 13, are plan views of the holding clamp in their conditions of FIGS. 10 and 11, respectively.
Figure 13:
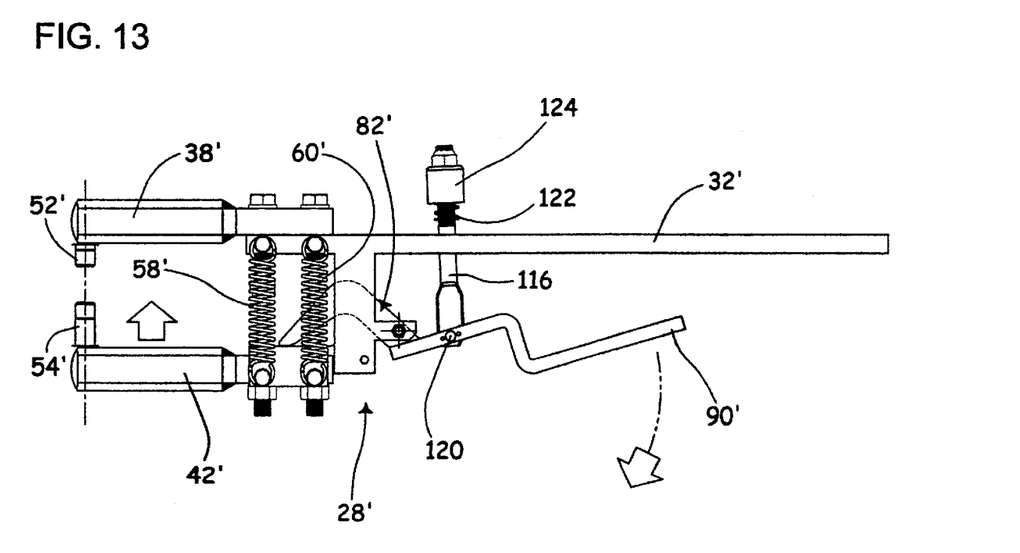
Figure 14:
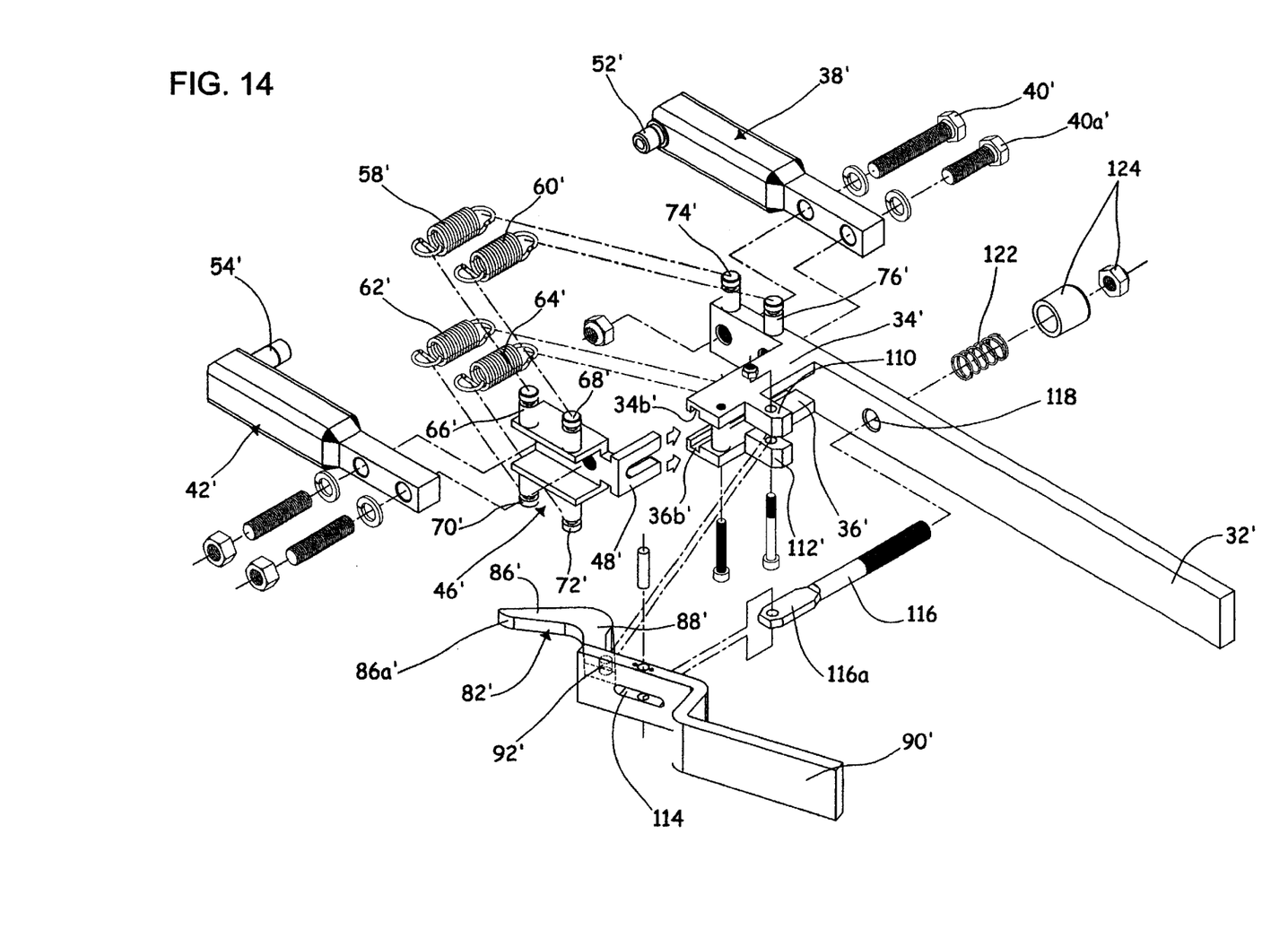
FIG. 14, is an exploded view of the second embodiment of holding clamp from FIGS. 9–13.

A second embodiment of holding clamp device is shown as 28' in FIGS. 10–14 of the drawings. All corresponding elements with the first embodiment will be primed. In this second embodiment of the invention, the main components remain substantially the same, including the V-shape cantilever arm 82', the carriage member 46', the two pairs of biasing coil springs 58', 60', 62', 64', the main elongated arm 32' and the two sheathed stud supporting bars 38', 42'. However, instead of having the maneuvering handle (90, first embodiment) pivoted outward away from arm 32 to spread apart the stud carrying bars (38, 42, first embodiment, FIG. 3), in the present embodiment, the operating linkage assembly for the cantilever arm 82' is inverted, so that—as illustrated in FIG. 11, it is as the handle bar 90' is pivoted toward main elongated clamp arm 32' that the stud carrying bars 38', 42', become progressively spread apart.

More particularly, the improvements brought about are directed at the cantilever arm 82', the transverse brackets 34', 36', and the linkage arm 94'. Cantilever member 82' is now integral to and generally coextensive with handle bar 90' by the outer end of its leg 88'. Cantilever leg 88' extends in between a pair of ears 110, 112, that transversely depend from the brackets 34', 36',. Ears 110, 112, extend away from stud bars 38', 42', and are bored so as to pivotally receive the pivot finger 92' of cantilever member leg 88'. Handle bar 90' includes an intermediate elbowed section 90'a, and an inner portion 90'b adjacent cantilever member 82' and comprising an ovoidal slot 114. Slot 114 is freely engaged by a short thinned section 116a of a half-threaded bolt 116, the opposite end of bolt 116 extending through a registering bore 118 made in the clamp main arm 32'. A pin 120 is mounted transversely through thinned bolt section 116a, so as to enable free limited sliding motion of bolt section 116 along ovoidal slot 114 of handle bar 90'; while a tension spring and nut assembly 122, 124, is mounted to bolt 116 on the side of bar 32' opposite handle 90'.

In operation, the linkage bolt 116 maintains handle 90' and V-cantilever arm 82' in their released condition, due to the bias of the four large compression springs 58'–64' but against the bias of the single small tension spring 122. As sequentially suggested in FIGS. 12 and 13, as the handle 90' is pushed toward arm 32', the integral cantilever arm 82' frictionally slides against carriage member 46' thus concurrently displacing carriage member 46' and stud arm 42' away from stationary stud bar 38', against the bias of the coil springs 58'–64' but yielding for a small part to the bias of the bolt spring 122.

Figure 15:
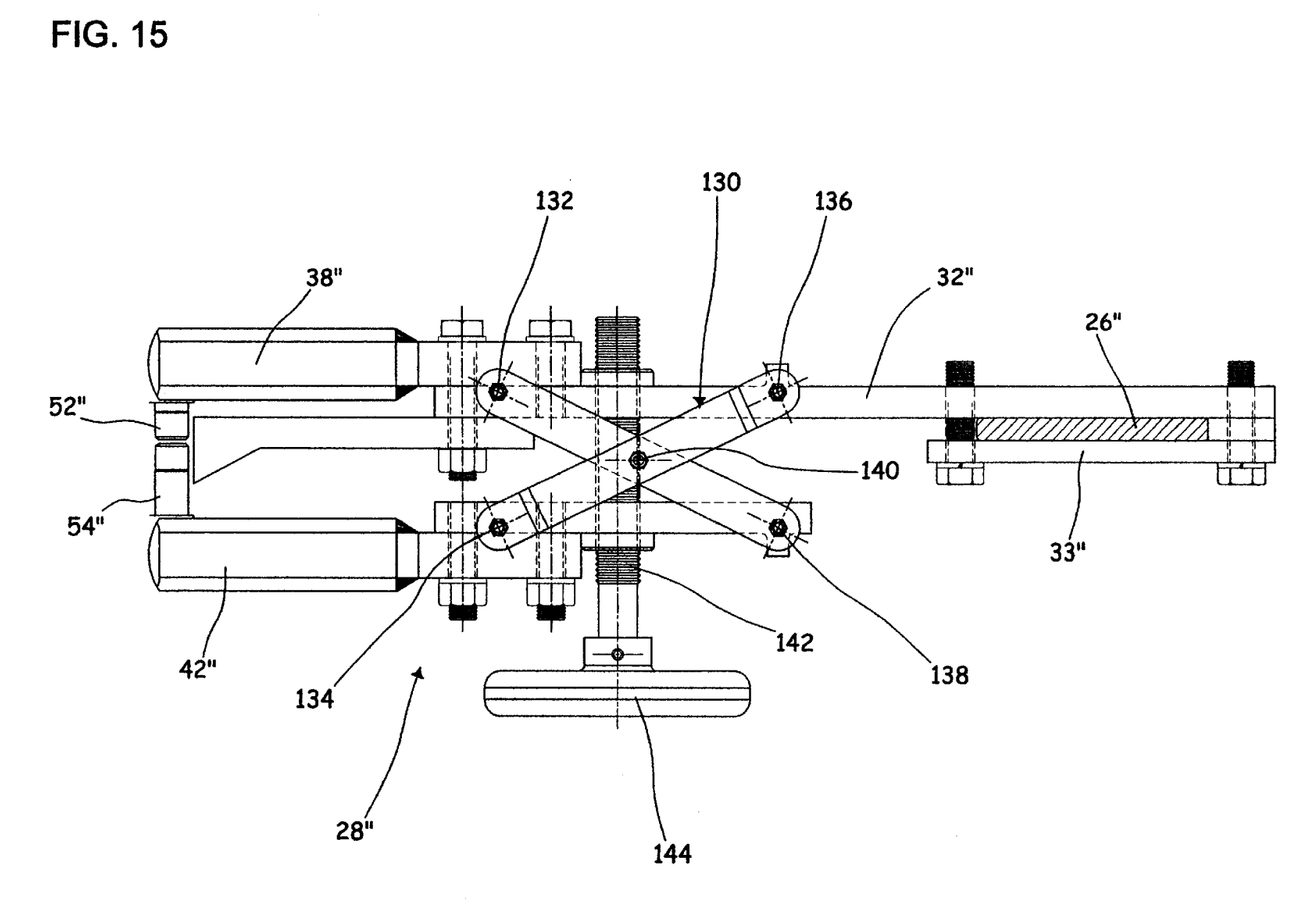
FIG. 15, is a plan view of an alternate third embodiment of holding clamp.

A third embodiment of article support device is schematically illustrated as 28" in FIG. 15 of the drawings. Corresponding elements relative to the first embodiment will be double primed. In this third embodiment, the movable stud carrying bar 42" is connected to the stationary stud carrying bar 38", simply by a pair of scisor linkage assemblies 130 (only one scisor linkage is shown in the figure). The five pivotal axes 132, 134, 136, 138, 140 of the linkages from the scisor linkage assembly 130 are all orthogonal to the plane extending through both stud carrying bars 38", 42". Relative movement of movable stud carrying bar 42" is controlled simply by an endless screw shaft member 142, being operatively connected to the scisor linkage assembly intermediate pivot mount 140. An enlarged rotatable wheel 144 is carried at the outer end of the shaft member 142, for facilitating rotation of the integral endless screw and therefore relative displacement of movable stud bar 42".

I claim:

1. A holding clamp for releasably holding a thickened planar article to be submerged in a liquid solution bath ahead of a submerged anode bar and to be electroplated therein, said holding clamp destined to downwardly depend from an overlying cathode frame bar, said holding clamp comprising:

a) an elongated main arm member, made from an electrically conducting material, and defining first and second opposite end portions;

b) a pair of first and second tubular bar members, each defining an outer end portion coated with a fluid-tight and electrically insulating sleeve and an opposite inner end portion, each bar member outer end portion having a transverse terminal stud projecting therefrom, said first bar member anchored at its said inner end portion to said main arm member first end portion parallel thereto;

c) a rail member, integral to an intermediate section of said main arm member and slidably engaged by said second bar member inner end portion, wherein said second bar member is maintained by said rail member parallel to said first bar and wherein said second bar member is movable relative to said first bar member while continuously remaining parallel thereto, while the pair of said terminal studs remain coaxially aligned;

d) a first biasing member, continuously biasing said first and second bar members toward one another; and e) a second biasing member, for discretely biasing said second bar member away from said first bar member, against the continuous bias of said first biasing member.

2. A holding clamp as in claim 1,

Wherein said first biasing means includes at least one pair of coil springs, hookingly interconnecting said first and second bar members.

3. A holding clamp as in claim 1,

Wherein said second biasing member includes an arcuate cantilever member defining an engagement leg and an opposite actuation leg, said engagement leg extending between said first and second bar members within their common plane, and a pivotal linkage assembly integral to said main arm member and pivotally mounting an intermediate section of said arcuate cantilever member;

Wherein upon actuation of said actuation leg to move the latter away from said main arm member, pivotal motion of said cantilever member will bring about frictional engagement of said cantilever member engagement leg against said second bar member for displacement of the latter away from said first bar member.

4. A holding clamp as in claim 3,

Wherein said cantilever member engagement leg includes a bevelled tip.

5. A holding clamp as in claim 3,

Further including an elongated handle, operatively mounted to said pivotal linkage assembly for facilitating actuation of said actuation leg.

6. A holding clamp as in claim 3,

Wherein said second biasing member includes an arcuate cantilever member defining an engagement leg and an opposite actuation leg, said engagement leg extending between said first and second bar members within their common plane, an elongated elbowed handle member integrally carried by said actuation leg coextensively thereto, and a straight link arm pivotally mounted to an intermediate section of said main arm member and pivotally mounting an intermediate section of said handle member; wherein upon actuation of said handle to move the latter toward said main arm member, there will be brought about frictional engagement of said cantilever member engagement leg against said second bar member for displacement of the latter away from said first bar member.

7. A holding clamp, for releasably holding an article to be submerged in a liquid solution bath ahead of a submerged anode bar and to be electroplated therein, said holding clamp destined to downwardly depend from an overlying cathode frame bar, said holding clamp comprising:

a) an elongated main arm member, made from an electrically conducting material, and defining first and second opposite end portions;

b) a pair of first and second tubular bar members, each defining an outer end portion coated with a fluid-tight and electrically insulating sleeve and an opposite inner end portion, each bar member outer end portion having a transverse terminal stud projecting therefrom, said first bar member anchored at its said inner end portion to said main arm member first end portion parallel thereto;

c) an endless screw member, integral to an intermediate section of said main arm member and to said second bar member inner end portion, said endless screw member maintaining said first and second bar members parallel to each other, and said second bar member being movable relative to said first bar member while continuously remaining parallel thereto, while the pair of said terminal studs remain coaxially aligned; and d) a biasing member, for discretely actuating said endless screw member for biasing said second bar member away from or toward said first bar member.

8. A holding clamp as in claim 7,

Wherein said biasing member is an enlarged wheel, carried at a free end portion of said endless screw member, said wheel being manually rotatable by an operator.

9. A holding clamp device, for releasably holding a thick planar article over ground, comprising:

a) an elongated main arm member, defining first and second opposite end portions;

b) a pair of first and second tubular bar members, each defining an outer end portion and an opposite inner end portion;

c) a rail member, integral to an intermediate section of said main arm member and slidably engaged by said second bar member inner end portion, wherein said second bar member is maintained by said rail member parallel to said first bar and wherein said second bar member is movable relative to said first bar member while continuously remaining parallel thereto;

d) a first biasing member, continuously biasing said first and second bar members toward one another; and e) a second biasing member, for discretely biasing said second bar member away from said first bar member, against the continuous bias of said first biasing member.

* * * * *